(12) United States Patent
Hung et al.

(10) Patent No.: US 6,650,005 B2
(45) Date of Patent: Nov. 18, 2003

(54) MICRO BGA PACKAGE

(75) Inventors: Chia-Yu Hung, Kaohsiung (TW);
Chun-Jen Su, Kaohsiung (TW);
Chien-Hung Lai, Kaohsiung (TW)

(73) Assignee: Walsin Advanced Electronics LTD, Kaosiung (TW)

( * ) Notice: Subject to any disclaimer, the term of this patent is extended or adjusted under 35 U.S.C. 154(b) by 0 days.

(21) Appl. No.: 10/156,002

(22) Filed: May 29, 2002

(65) Prior Publication Data

US 2002/0190366 A1 Dec. 19, 2002

(30) Foreign Application Priority Data

Jun. 13, 2001 (CH) ........................... 90114497 A

(51) Int. Cl.[7] ............ H01L 23/06; H01L 23/12
(52) U.S. Cl. ............ 257/684; 257/684; 257/670; 257/783; 257/787
(58) Field of Search ................. 257/693, 684, 257/670, 783, 787

(56) References Cited

U.S. PATENT DOCUMENTS

| 5,420,460 | A | * | 5/1995 | Massingill .................. 257/668 |
| 5,776,796 | A | | 7/1998 | Distefano et al. ............ 438/106 |
| 5,844,168 | A | * | 12/1998 | Schueller et al. ........... 174/52.4 |
| 6,013,946 | A | * | 1/2000 | Lee et al. .................... 257/684 |
| 6,218,731 | B1 | * | 4/2001 | Huang et al. ................ 257/738 |
| 6,252,298 | B1 | * | 6/2001 | Lee et al. .................... 257/668 |
| 6,320,267 | B1 | * | 11/2001 | Yukawa ...................... 257/783 |

* cited by examiner

*Primary Examiner*—Jasmine Clark
(74) *Attorney, Agent, or Firm*—Troxell Law Office PLLC

(57) ABSTRACT

A micro BGA package comprises a die, a wiring board, a plurality of metal bonding wires, a plurality of solder balls, and a package body. The wiring board has a die-attaching surface, a surface-mounting surface with solder balls, and lateral surfaces between the die-attaching surface and the surface-mounting surface. The package body has a fastener covering and extending around the lateral surfaces of the wiring board for improving the bonding strength between wiring board and die and avoiding delamination. Preferably, the wiring board has a plurality of support bars for supporting the wiring board during molding.

16 Claims, 3 Drawing Sheets

MICRO BGA PACKAGE

FIELD OF THE INVENTION

The present invention is relating to an integrated circuit package, particularly to an integrated circuit package with micro BGA configuration.

BACKGROUND OF THE INVENTION

In the integrated circuit packaging industry, it is a trend that a lead frame being as a die carrier has been displaced by a wiring substrate, such as BGA substrate (Ball Grid Array substrate) that generally is to adhere a die on a surface of BGA substrate and to bond solder balls on another surface of wiring substrate for surface mounting.

An integrated circuit package with micro BGA configuration is disclosed in U.S. Pat. No. 5,776,796 "method of encapsulating a semiconductor package". As shown in FIG. 1, a semiconductor die package 10 comprises a semiconductor die 12 and a die carrier 14. The die carrier 14 is composed of a dielectric layer 16 and a spacer layer 20 with elasticity. A plurality of leads 22 electrically connect the semiconductor die 12 with the dielectric layer 16 of die carrier 14 made from a thin sheet of polyimide, so that the semiconductor die 12 can electrically connect to the terminals 26 on the top surface 18 of the die carrier 14. The semiconductor package 10 is set in a frame 42, a cover 30 is attached below the frame 42, and the cover 30 attaches the top surface 18 of die carrier 14 for protecting the terminal 26 during encapsulating. Next, the introduction of package body 40 may carry out by using needle-like dispenser 32. Comparing naturally potting method with molding technique, the leads 22 form many tiny apertures between die 12 and dielectric layer 16 so that gas bubbles are easy to be formed, otherwise a vacuum laminating is necessary. Moreover, the shape of solidified package body 40 has no mechanically fastening function but adhesive function against the die carrier 14. Moisture will permeates into the interface between the package body 40 and the dielectric layer 16. The bonding strength between semiconductor die 12 and die carrier 14 becomes weaker resulting in delamination or popcorn easily.

SUMMARY

A first object of the present invention is to provide an integrated circuit package with excellent bonding strength between wiring board and chip without delamination happen. A package body has a fastener extending around the lateral surfaces of the wiring board to hold wiring board.

A second object of the present invention is to provide an integrated circuit package, which comprises a wiring board having support bars. The support bars allow an extending fastener of package body to be formed around the lateral surfaces of wiring board for forming a well-bonded package body by molding method. The extending fastener prevents moisture from penetrating into the lateral surfaces of wiring board.

In accordance with the integrated circuit package of the present invention, it comprises a wiring board having a die-attaching surface, a surface-mounting surface and lateral surfaces between the die-attaching surface and the surface-mounting surface. Preferably, the wiring board has a plurality of support bars for supporting the wiring board during molding. A die having a plurality of bonding pads is adhered on the die-attaching surface of wiring board. The bonding pads of die are electrically connected with the wiring board by a plurality of metal bonding wires. A package body formed by molding seals the metal bonding wires and has an extending fastener around the lateral surfaces of the wiring board for holding the wiring board.

DETAILED DESCRIPTION OF THE PRESENT INVENTION

Figure 1:
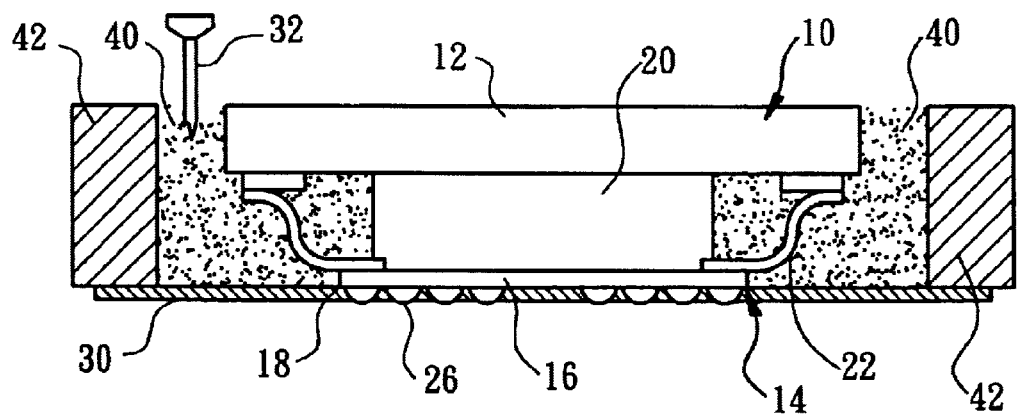
FIG. 1 is a cross-sectional view of a semiconductor chip package being encapsulated within a frame disclosed in U.S. Pat. No. 5,776,796 "method of encapsulating a semiconductor package".

Referring to the drawings attached, the present invention will be described by means of the embodiments below.

Figure 2:
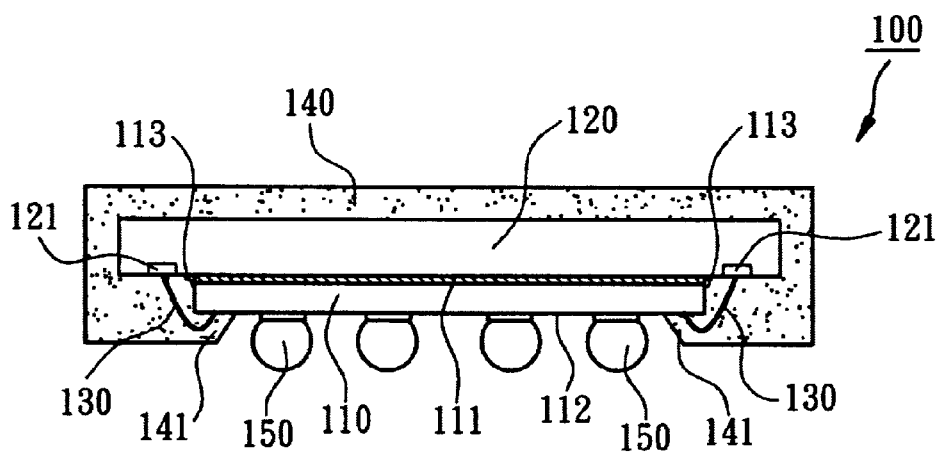
FIG. 2 is a cross-sectional view of an integrated circuit package in accordance with the first embodiment of the present invention.
Figure 3:
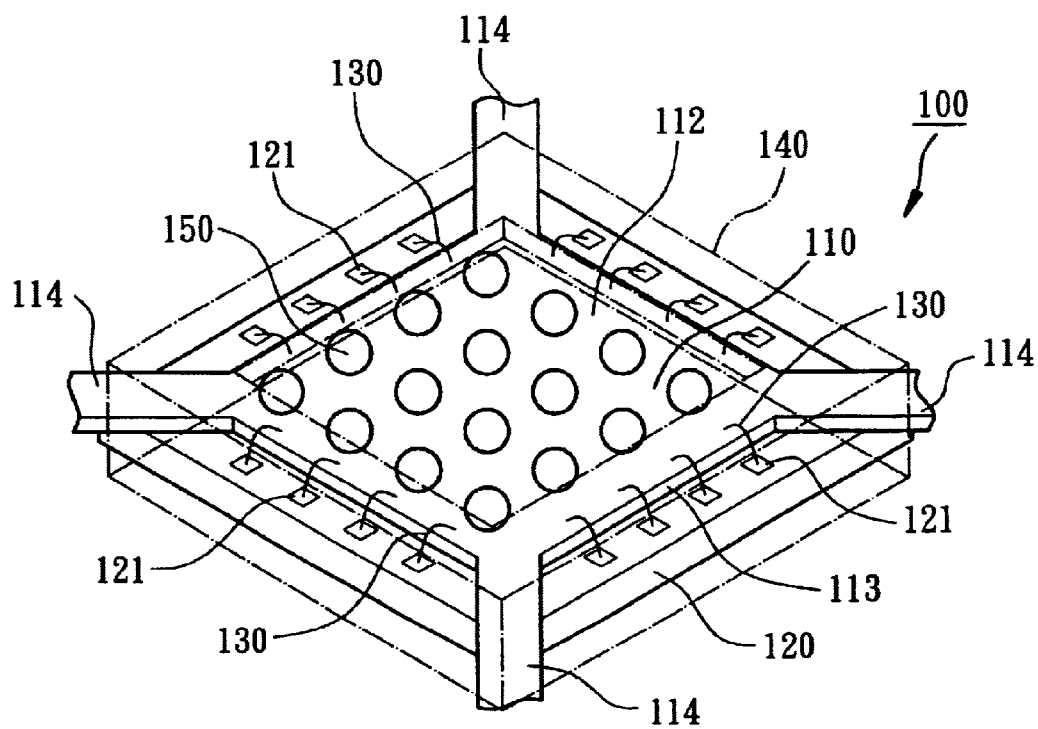
FIG. 3 is a three dimensional diagram illustrating the integrated circuit package in accordance with the first embodiment of the present invention.

According to the first embodiment of the present invention, FIG. 2 is a cross-sectional view of an integrated circuit package 100 with micro BGA (Ball Grid Array) configuration, FIG. 3 is a three dimensional diagram illustrating the integrated circuit package 100.

As shown in FIGS. 2 and 3, the integrated circuit package 100 comprises a A wiring board 110, a die 120, a plurality of metal bonding wires 130, a plurality of solder balls 150, and a package body 140.

The die 120 can be a memory die, microprocessor, logic die or other dies such as DRAM, SRAM, SDRAM, ROM, EPROM, flash, Rambus or DDR, etc. As shown in FIGS. 2 and 3, the die 120 has an integrated circuit forming surface and a plurality of bonding pads 121 around perimeters of the integrated circuit forming surface, and is adhered on the wiring board 110. The integrated circuit forming surface of the die 120 faces toward the wiring board 110. For example, the die 120 is adhered by adhesive compound such as double-sided adhesive polyimide tape, liquid thermoplastic adhesives or epoxy compound.

The wiring board 110 is a micro printed wiring board made from FR-4, FR-5 or BT resin, etc which includes resin material reinforced with glass fiber. The wiring board 110 has circuit pattern of single-layer or multi-layer (i.e. single-layer printed wiring board or multi-layer printed wiring board or even a polyimide thin film with single-layer circuit pattern). Alternatively the wiring board 110 is a co-fired ceramics wiring board. The wiring board 110 has a die-attaching surface 111, a surface-mounting surface 112 and lateral surfaces 113 between the die-attaching surface 111 and the surface-mounting surface 112. The surface-mounting surface 112 is used to bond Pb—Sn solder balls 150 for surface mounting, the die-attaching surface 111 is used to adhere die 120. In this embodiment, the wiring board 110 has integrally support bars 114 (as shown in FIG. 3) to connect several wiring boards 110 in the manufacturing process. The bonding pads 121 of die 120 can be exposed after adhering die 120 for inner electrical connection. The metal bonding wires 130 are made of gold, copper or copper alloy to connect the bonding pads 121 of the die 120 with the wiring board 110. A well-bonded package body 140 can be formed by molding method.

The package body 140 sealing the metal bonding wires 130 is a thermosetting insulation material such as epoxy resin including inorganic filler. In this embodiment, the package body 140 is formed by molding method. Due to the support bars the assembly of die 120 and wiring board 110 may be positioned in a mold cave, then encapsulating the package body 140. The package body 140 has an integral fastener 141 extending around the lateral surfaces 113 of the wiring board 110 for holding the wiring board 110. The fastener 141 covers the lateral surfaces 113 of the wiring board 110 (the portions without solder resist) in order to prevent moisture from penetrating into the lateral surfaces 113 of the wiring board 110. Therefore, problems of delamination and popcorn are lessened. In this embodiment, the package body 140 further seals the die 120, and the fastener 141 thereof extends to the surface-mounting surface 112 of the wiring board 110 for enhancing the bonding strength between wiring board 110 and die 120.

Figure 4:
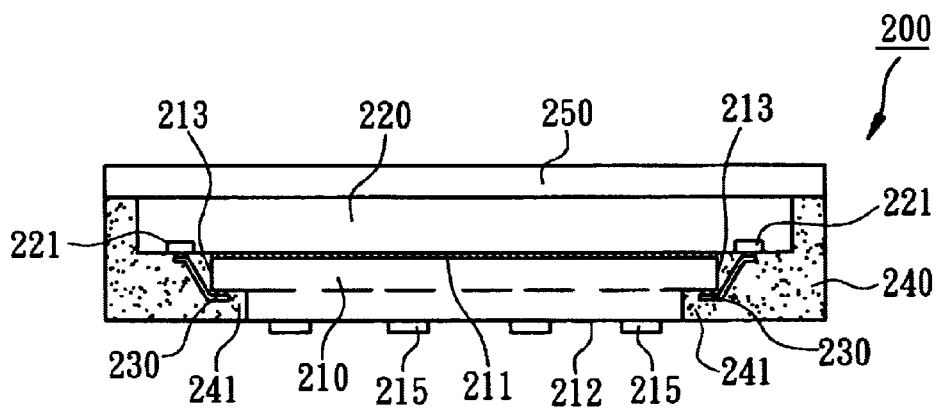
FIG. 4 is a cross-sectional view of an integrated circuit package in accordance with the second embodiment of the present invention.

In the second embodiment of the present invention, as shown in FIG. 4, an integrated circuit package 200 with micro LGA (Land Grid Array) configuration comprises a wiring board 210, a die 220, a heat-dissipating device 250 and a package body 240. The heat-dissipating device 250 is a metal board, such as copper or aluminium, which is fixed on the back surface of the die 220 for improving thermal dissipation and preventing transformation of the integrated circuit package 200. The die 220 has a plurality of bonding pads 221 at the perimeters of active surface thereof. The wiring board 210 is a multi-layer printed wiring board, has a die-attaching surface 211, a surface-mounting surface 212 and lateral surfaces 213 between the die-attaching surface 211 and the surface-mounting surface 212. The die-attaching surface 211 adheres the die 220, and the surface-mounting surface 212 has a plurality of terminals 215 as flat or bump type to become outer connecting terminals of the integrated circuit package 200. The lateral surfaces 213 have ladder gaps for filling fastener 241 of the package body 240. Besides, the ILB leads 230 (Inner Lead Bonding) electrically connect the die 220 and the wiring board 210. The package body 240 not only seals the ILB leads 230, but also has an integral fastener 241 extending to the lateral surfaces 213 to become hook shape. The fastener 241 holds the wiring board 210 for enhancing the bonding strength of the wiring board 210 within the integrated circuit package 200.

Figure 5:
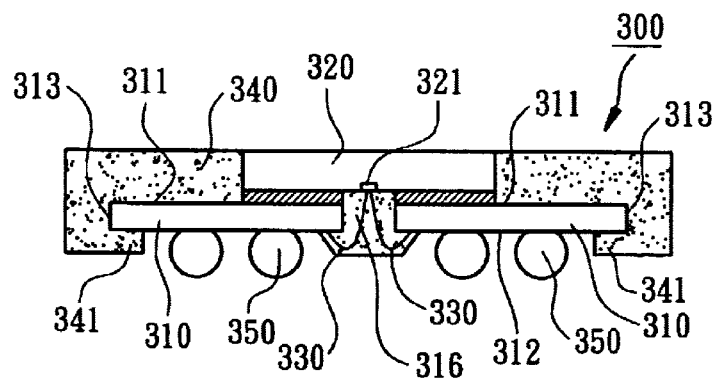
FIG. 5 is a cross-sectional view of an integrated circuit package in accordance with the third embodiment of the present invention.
Figure 6:
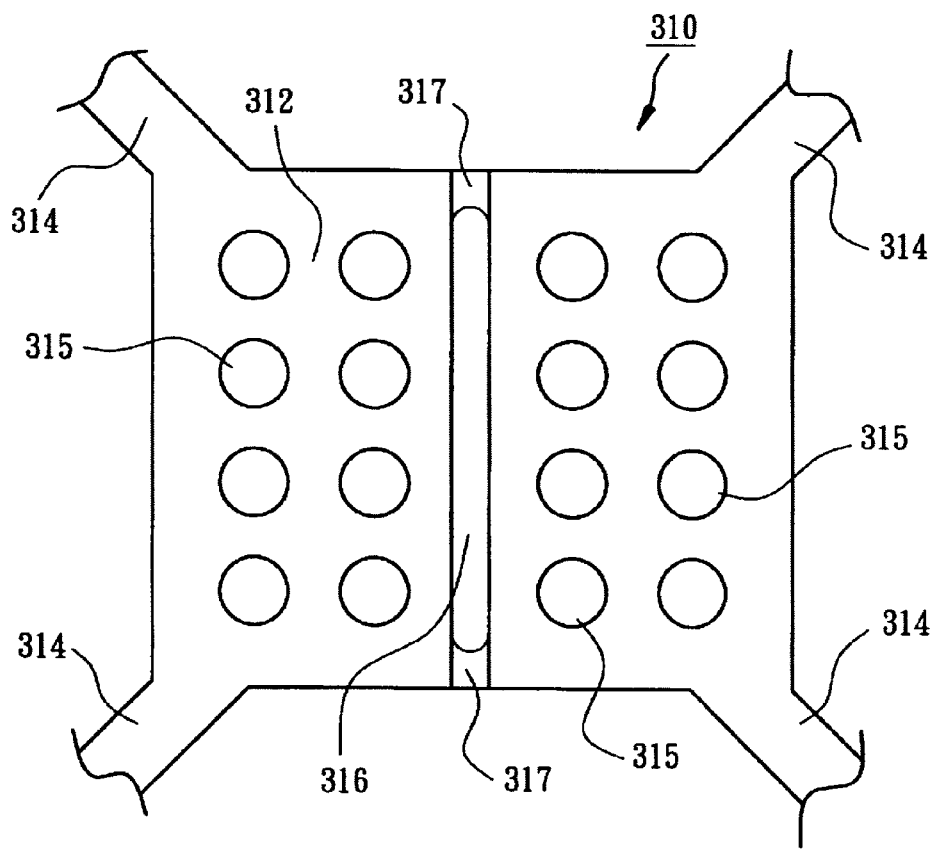
FIG. 6 is a bottom view of wiring board of the integrated circuit package in accordance with the third embodiment of the present invention.

In the third embodiment of the present invention, as shown in FIG. 5, an integrated circuit package 300 comprises a wiring board 310, a die 320, a plurality of metal bonding wires 330 and a package body 340. As shown in FIGS. 5 and 6, the wiring board 310 has a die-attaching surface 311 for adhering the die 320, a surface-mounting surface 312, an opening 316 and lateral surfaces 313 between the die-attaching surface 311 and the surface-mounting surface 312. The surface-mounting surface 312 has a plurality of connecting pads 315 for bonding the solder balls 350. The opening 316 exposes the bonding pads 321 at the center of die 320 and a depression 317 is formed around the opening 316 for allowing the package body 340 to fill the opening 316. Moreover, The wiring board 310 further comprises integrated support bars 314 for supporting the wiring board 310 during molding and allowing the lateral surfaces 313 to be covered by the package body 340. The package body 340 has a fastener 341 to fix the wiring board 310 and extend to the surface-mounting surface 312 of the wiring board 310 in order to enhance the bonding strength between wiring board 310 and die 320.

The above description of embodiments of this invention is intended to be illustrative and not limiting. Other embodiments of this invention will be obvious to those skilled in the art in view of the above disclosure.

What is claimed is:

1. A micro BGA (Ball Grid Array) package comprising:

a wiring board haying a die-attaching surface, a surface-mounting surface, lateral surfaces between the die-attaching surface and the surface-mounting surface, and a plurality of integrally support bars for supporting the wiring board during molding;

a die attached to the die-attaching surface of the wiring board and having a plurality of bonding pads;

a plurality of electrically connecting devices connecting the bonding pads with the wiring board;

a molding package body sealing the plurality of electrically connecting devices, wherein the package body has an integral fastener covering and extending around the lateral surfaces of the wiring board; and a plurality of solder balls bonded to the surface-mounting surface of the wiring board.

2. The micro BGA package according to claim 1, wherein the integral fastener of the package body extends onto the surface-mounting surface of the wiring board.

3. The micro BGA package according to claim 1, wherein the wiring board is selected from the group consisting of a printed wiring board, a circuit-patterned thin film and a ceramic wiring board.

4. The micro BGA package according to claim 3, wherein the package body seals the die.

5. The micro BGA package according to claim 4, further comprising a heat-dissipating device.

6. A integrated circuit package comprising:

a wiring board haying a die-attaching surface, a surface-mounting surface, lateral surfaces between the die-attaching surface and the surface-mounting surface, and integrated support bars;

a die attached to the die-attaching surface of the wiring board and having a plurality of bonding pads;

a plurality of electrically connecting devices connecting the bonding pads with the wiring board;

a package body sealing the plurality of electrically connecting devices and having a fastener extending around the lateral surfaces of the wiring board.

7. The integrated circuit package according to claim 6, wherein each lateral surface of the wiring board has a gap to be filled with the fastener.

8. The integrated circuit package according to claim 6, wherein the fastener of the package body extends to the surface-mounting surface of the wiring board.

9. The integrated circuit package according to claim 6, wherein the package body seals the die.

10. The integrated circuit package according to claim 6, further comprising a heat-dissipating device.

11. The integrated circuit package according to claim 6, wherein the wiring board has an opening for allowing the plurality of electrically connecting devices to pass through to connect with the plurality of bonding pads of the die.

12. An integrated circuit package comprising:
a multi-layer wiring board having a die-attaching surface, a surface-mounting surface, integrated support bars, an opening and at least one lateral surface between the die-attaching surface and the surface-mounting surface;
a die adhered to the die-attaching surface of the wiring board and having a plurality of bonding pads;
a plurality of electrically connecting devices connecting the plurality of bonding pads of the die to the wiring board; and
a package body sealing the plurality of electrically connecting devices and having a fastener covering the lateral surface of the wiring board to prevent moisture from penetrating into the lateral surface of the wiring board.

13. The integrated circuit package according to claim 12, wherein surfaced of the wiring board has a gap to be filled with the fastener.

14. The integrated circuit package according to claim 12, wherein the fastener of the package body extends to the surface-mounting surface of the wiring board.

15. The Integrated circuit package according to claim 12, wherein the package body seals the die.

16. The integrated circuit package according to claim 12, further comprising a heat-dissipating device.

* * * * *